United States Patent
Xiao et al.

(10) Patent No.: US 12,262,523 B2
(45) Date of Patent: Mar. 25, 2025

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 490 days.

(21) Appl. No.: 17/818,537

(22) Filed: Aug. 9, 2022

(65) Prior Publication Data
US 2023/0171939 A1    Jun. 1, 2023

Related U.S. Application Data

(63) Continuation of application No. PCT/CN2022/077681, filed on Feb. 24, 2022.

(30) Foreign Application Priority Data

Nov. 30, 2021  (CN) .......................... 202111444518.0

(51) Int. Cl.
H10B 12/00       (2023.01)
(52) U.S. Cl.
CPC ....... *H10B 12/0383* (2023.02); *H10B 12/482* (2023.02); *H10B 12/488* (2023.02)

(58) Field of Classification Search
CPC . H10B 12/0383; H10B 12/482; H10B 12/488
See application file for complete search history.

(56) References Cited

U.S. PATENT DOCUMENTS 8,946,670 B1 *  2/2015  Park ................... H10D 30/0227
                                                    257/329
9,112,032 B1 *  8/2015  Liu ....................... H10D 30/024
(Continued)

FOREIGN PATENT DOCUMENTS

CN         104425608 A      3/2015
CN         106952816 A  *  7/2017  ............. H01L 21/28
(Continued)

OTHER PUBLICATIONS

International Search Report cited in PCT/CN2022/077639 mailed May 19, 2022, 9 pages.
(Continued)

*Primary Examiner* — Laura M Menz
(74) *Attorney, Agent, or Firm* — Syncoda LLC; Feng Ma

(57) ABSTRACT

The present disclosure provides a manufacturing method of a semiconductor structure and a semiconductor structure. The manufacturing method of a semiconductor structure includes: providing a substrate; forming a plurality of silicon pillars on the substrate, where the silicon pillars are arranged as an array; preprocessing the silicon pillar to form an active pillar, where the active pillar includes a first segment, a second segment, and a third segment; forming a first gate oxide layer on sidewalls of the second segment and the third segment; and forming a second gate oxide layer on the first gate oxide layer, where a length of the second gate oxide layer is less than that of the first gate oxide layer, and a thickness of the second gate oxide layer is greater than that of the first gate oxide layer.

17 Claims, 8 Drawing Sheets

(56) References Cited

U.S. PATENT DOCUMENTS

| | | | |
|---|---|---|---|
| 11,854,862 B2* | 12/2023 | Shao | H10B 12/482 |
| 2006/0043472 A1* | 3/2006 | Wang | H01L 27/0207 |
| | | | 257/330 |
| 2007/0082448 A1* | 4/2007 | Kim | H10B 12/482 |
| | | | 257/E21.41 |
| 2011/0121396 A1* | 5/2011 | Lee | H01L 29/7831 |
| | | | 257/E29.264 |
| 2021/0296316 A1* | 9/2021 | Zhu | H01L 27/092 |
| 2023/0005928 A1* | 1/2023 | Wu | H10B 12/482 |
| 2023/0014198 A1* | 1/2023 | Shao | H10B 12/0387 |
| 2023/0015279 A1* | 1/2023 | Shao | H10B 12/033 |
| 2023/0016905 A1* | 1/2023 | Shao | H10B 12/395 |
| 2023/0111385 A1* | 4/2023 | Lu | H10B 12/053 |
| | | | 257/296 |
| 2023/0170416 A1* | 6/2023 | Xiao | H10D 64/252 |
| | | | 257/329 |
| 2023/0171938 A1* | 6/2023 | Xiao | H10B 12/053 |
| | | | 439/270 |
| 2023/0171939 A1* | 6/2023 | Xiao | H10B 12/0383 |
| | | | 438/270 |
| 2023/0171940 A1* | 6/2023 | Xiao | H10B 12/482 |
| | | | 257/296 |
| 2023/0171941 A1* | 6/2023 | Xiao | H10B 12/488 |
| | | | 257/296 |
| 2023/0171942 A1* | 6/2023 | Xiao | H10B 12/31 |
| | | | 257/296 |
| 2023/0189508 A1* | 6/2023 | Shao | H10B 12/482 |
| | | | 438/618 |
| 2023/0231008 A1* | 7/2023 | Jang | H01L 21/8234 |
| 2023/0292486 A1* | 9/2023 | Shao | H10B 12/377 |
| 2023/0335430 A1* | 10/2023 | Shao | H01L 21/76205 |
| 2023/0345706 A1* | 10/2023 | Liu | H10B 12/482 |
| 2023/0413528 A1* | 12/2023 | Xiao | H10B 12/05 |
| 2023/0422467 A1* | 12/2023 | Xiao | H01L 29/66666 |
| 2023/0422480 A1* | 12/2023 | Yan | H10B 12/0335 |
| 2024/0032273 A1* | 1/2024 | Chen | H01L 29/7869 |
| 2024/0049457 A1* | 2/2024 | Xiao | H01L 29/7869 |
| 2024/0274684 A1* | 8/2024 | Shao | H10D 64/666 |

FOREIGN PATENT DOCUMENTS

| | | | | |
|---|---|---|---|---|
| CN | 107039272 A | * | 8/2017 | H01L 21/28247 |
| CN | 107170685 A | * | 9/2017 | H01L 29/66795 |
| CN | 108389896 A | | 8/2018 | |
| CN | 108807545 A | | 11/2018 | |
| CN | 109449158 A | | 3/2019 | |
| CN | 109841522 A | | 6/2019 | |
| CN | 109979880 A | * | 7/2019 | H01L 21/823431 |
| CN | 109979880 B | * | 6/2021 | H01L 21/823431 |
| CN | 113611671 A | | 11/2021 | |
| CN | 114141712 A | * | 3/2022 | H01L 27/108 |
| CN | 114141713 A | * | 3/2022 | H01L 27/10864 |
| CN | 114141714 A | * | 3/2022 | H01L 27/10814 |
| CN | 114141715 A | * | 3/2022 | H01L 27/10814 |
| CN | 114156236 A | * | 3/2022 | H01L 27/10864 |
| CN | 114256158 A | * | 3/2022 | H01L 27/10814 |
| CN | 115224110 A | * | 10/2022 | H01L 21/764 |
| CN | 115360194 A | * | 11/2022 | G11C 5/063 |
| CN | 114141715 B | * | 6/2023 | H01L 27/10814 |
| CN | 116669419 A | * | 8/2023 | H10B 12/02 |
| CN | 119072114 A | * | 12/2024 | |
| EP | 4221481 A1 | * | 8/2023 | H01L 27/10823 |
| WO | WO-2023279494 A1 | * | 1/2023 | H01L 21/823412 |
| WO | WO-2023082457 A1 | * | 5/2023 | H01L 27/11521 |
| WO | WO-2023097900 A1 | * | 6/2023 | H01L 27/10814 |
| WO | WO-2023097902 A1 | * | 6/2023 | H01L 27/10864 |
| WO | WO-2023130698 A1 | * | 7/2023 | H01L 27/10814 |
| WO | WO-2023206812 A1 | * | 11/2023 | H10B 12/053 |
| WO | WO-2023245758 A1 | * | 12/2023 | H01L 27/10838 |
| WO | WO-2023245803 A1 | * | 12/2023 | H10B 12/036 |

OTHER PUBLICATIONS

First Office Action cited in CN202111444498.7, mailed May 16, 2022, 23 pages.

International Search Report cited in PCT/CN2022/077681 mailed Aug. 9, 2022, 8 pages.

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2022/077681, filed on Feb. 24, 2022, which claims the priority to Chinese Patent Application No. 202111444518.0, titled "MANUFACTURING METHOD OF SEMICONDUCTOR STRUCTURE AND SEMICONDUCTOR STRUCTURE" and filed on Nov. 30, 2021. The entire contents of International Patent Application No. PCT/CN2022/077681 and Chinese Patent Application No. 202111444518.0 are incorporated herein by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure, where the manufacturing method of a semiconductor structure includes: providing a substrate;
forming a plurality of silicon pillars on the substrate, where the silicon pillars are arranged as an array;
preprocessing the silicon pillar to form an active pillar, where along a first direction, the active pillar includes a first segment, a second segment, and a third segment that are sequentially connected;
forming a first gate oxide layer on sidewalls of the second segment and the third segment; and
forming a second gate oxide layer on the first gate oxide layer, where along the first direction, a length of the second gate oxide layer is less than that of the first gate oxide layer, a top surface of the second gate oxide layer is flush with that of the third segment, and a thickness of the second gate oxide layer is greater than that of the first gate oxide layer.

A second aspect of the present disclosure provides a semiconductor structure, where the semiconductor structure includes:
a substrate;
a plurality of active pillars, arranged as an array in the substrate, where each of the active pillars includes, along a first direction, a first segment, a second segment, and a third segment that are sequentially connected;
a first gate oxide layer, where the first gate oxide layer covers sidewalls of the second segment and the third segment; and
a second gate oxide layer, disposed on an outer side of the first gate oxide layer, where along the first direction, a length of the second gate oxide layer is less than that of the first gate oxide layer, a top surface of the second gate oxide layer is flush with that of the third segment, and a thickness of the second gate oxide layer is greater than that of the first gate oxide layer.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

Figure 1:
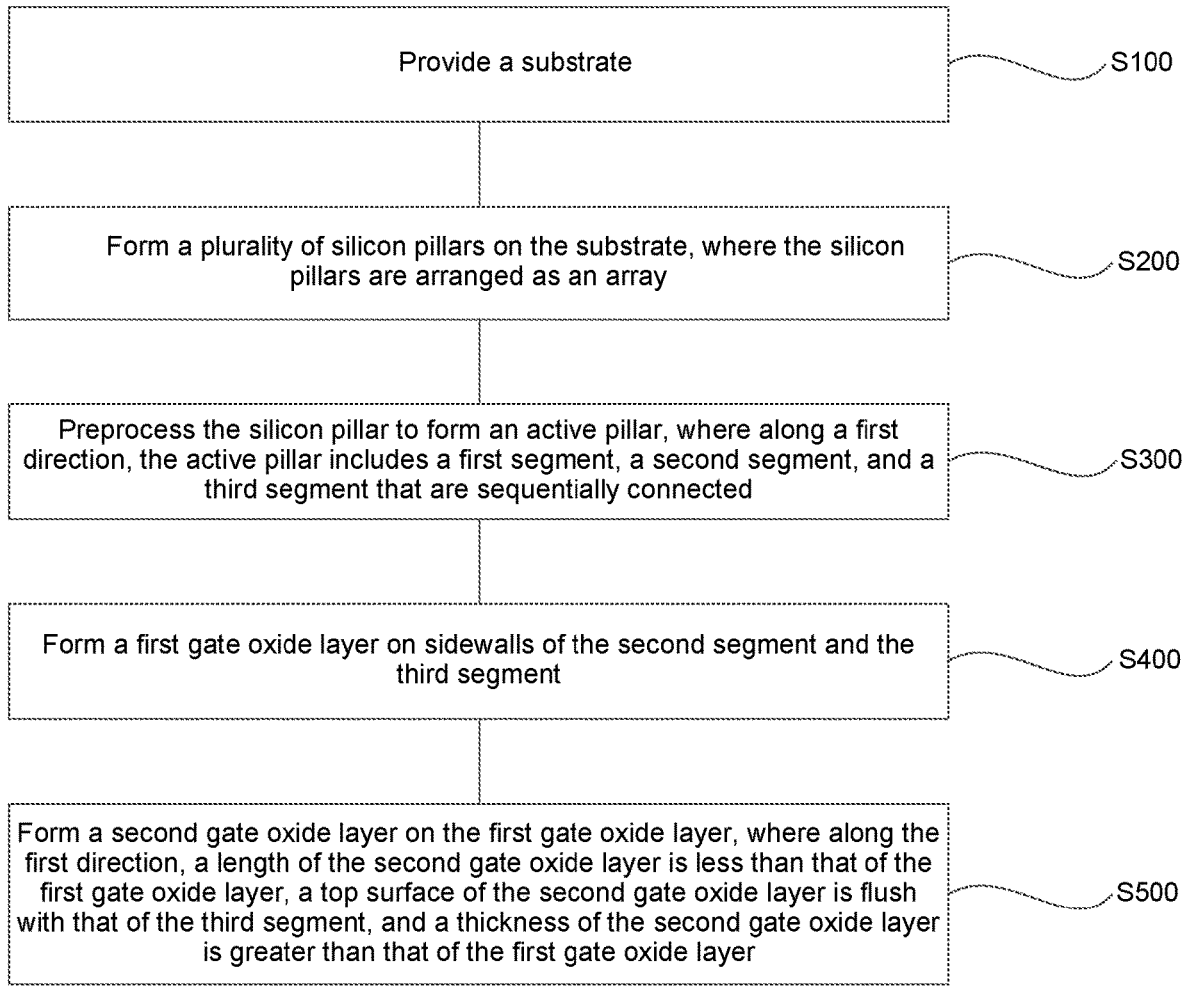
FIG. 1 is a flowchart of a manufacturing method of a semiconductor structure according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In a semiconductor structure, the transistor can be understood as a current switch structure made of a semiconductor material. A metal gate is disposed between the source and the drain of the transistor, and the metal gate can be used to control on/off of a current between the source and the drain. A gate-all-around (GAA) transistor adopts a GAA technology. With the development of semiconductor processes, a size of a semiconductor device is becoming smaller. In addition, GIDL occurs in a process of forming a structure of the GAA transistor, reducing performance and a yield of the semiconductor structure.

In a manufacturing method of a semiconductor structure and a semiconductor structure provided in the embodiments of the present disclosure, a first gate oxide layer is formed on sidewalls of a second segment and a third segment of an active pillar, and a second gate oxide layer is formed on the first gate oxide layer, so as to increase a thickness of a gate oxide layer of the active pillar and a charge storage capability of the gate oxide layer, and effectively reduce a GIDL current and interband tunneling. In addition, a length of the second gate oxide layer is less than that of the first gate oxide layer, a thickness of the second gate oxide layer is greater than that of the first gate oxide layer, and a top surface of the second gate oxide layer is flush with that of the third segment, such that two gate oxide layers with different thickness are formed at different positions of the second segment, and a thickness of a gate oxide layer formed on the third segment is the same as that of the thicker gate oxide layer on the second segment, to make potentials at both ends of the second segment different. This is conducive to controlling a turn-off current of a semiconductor structure and effectively improving performance and a yield of the semiconductor structure.

Exemplary embodiments of the present disclosure provide a manufacturing method of a semiconductor structure. The following describes the manufacturing method of a semiconductor structure with reference to FIG. 1 to FIG. 28.

There are no limits made on the semiconductor structure in the embodiments. The semiconductor structure is described below by a DRAM as an example, but is not limited thereto in the embodiments. Alternatively, the semiconductor structure in the embodiments may be another structure, for example, a GAA transistor or a vertical gate-all-around (VGAA) transistor.

As shown in FIG. 1, an exemplary embodiment of the present disclosure provides a manufacturing method of a semiconductor structure, including the following steps:

Step S100: Provide a substrate.

Step S200: Form a plurality of silicon pillars on the substrate, where the silicon pillars are arranged as an array.

Step S300: Preprocess the silicon pillar to form an active pillar, where along a first direction, the active pillar includes a first segment, a second segment, and a third segment that are sequentially connected.

Step S400: Form a first gate oxide layer on sidewalls of the second segment and the third segment.

Step S500: Form a second gate oxide layer on the first gate oxide layer, where along the first direction, a length of the second gate oxide layer is less than that of the first gate oxide layer, a top surface of the second gate oxide layer is flush with that of the third segment, and a thickness of the second gate oxide layer is greater than that of the first gate oxide layer.

According to an exemplary embodiment, this embodiment is a further description of step S100 described above.

Figure 2:
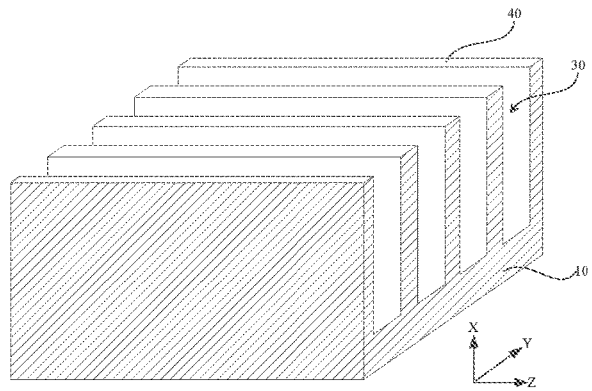
FIG. 2 is a schematic diagram of forming a strip body in a manufacturing method of a semiconductor structure according to an exemplary embodiment.

As shown in FIG. 2, the substrate 10 is provided. The substrate 10 serves as a support member of a DRAM and is configured to support other components provided thereon. The substrate 10 may be made of a semiconductor material. The semiconductor material may be one or more of silicon, germanium, a silicon-germanium compound, and a silicon-carbon compound. In this embodiment, the substrate 10 is made of silicon. The use of silicon as the substrate 10 in this embodiment is to facilitate understanding of a subsequent forming method by those skilled in the art, rather than to constitute a limitation. In an actual application process, an appropriate material of the substrate may be selected as required.

According to an exemplary embodiment, this embodiment is a further description of step S200 described above.

Figure 3:
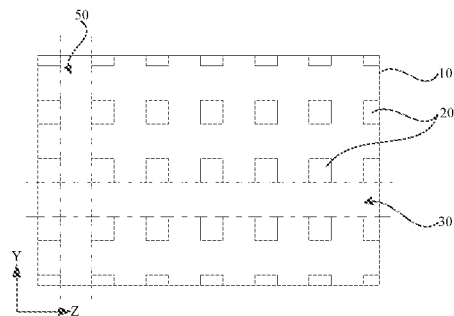
FIG. 3 is a top view of forming a silicon pillar in a manufacturing method of a semiconductor structure according to an exemplary embodiment.

As shown in FIG. 3, the silicon pillars 20 are formed on the substrate 10. The silicon pillars 20 are arranged as the array on the substrate 10, in other words, the silicon pillars 20 can be arranged in a plurality of rows and a plurality of columns. With a plane parallel to the first direction X as a cross section, a cross-sectional shape of the silicon pillar 20 includes a square. Referring to FIG. 3, using an orientation shown in the figure as an example, the first direction X is an extension direction from a bottom surface of the substrate 10 to a top surface of the substrate 10.

Referring to FIG. 2 and FIG. 3, in some embodiments, the silicon pillars 20 arranged as the array may be formed on the substrate 10 by the following method:

At first, a plurality of bit line isolation trenches 30 are formed in the substrate 10, and the bit line isolation trenches 30 are disposed at intervals along a second direction Y. The substrate 10 between adjacent ones of the bit line isolation trenches 30 forms a strip body 40.

In a process of forming the bit line isolation trench 30 on the substrate 10, a mask layer with a mask pattern can be first formed on the substrate 10, a direction from the top surface of the substrate 10 to the bottom surface of the substrate 10 is taken as an extension direction, and along the extension direction, a part of the substrate 10 is removed based on the mask pattern to form the bit line isolation trenches 30 disposed at intervals along the second direction Y.

Then, a plurality of word line isolation trenches 50 are formed in the substrate 10. The word line isolation trenches 50 are disposed at intervals along a third direction Z. The strip body 40 is separated into the silicon pillars 20 by the word line isolation trenches 50 disposed along the third direction Z. In this embodiment, along the first direction X, a depth of the word line isolation trench 50 is less than that of the bit line isolation trench 30.

Referring to FIG. 2, using an orientation shown in the figure as an example, the third direction Z is an extension direction parallel to a front side face of the substrate 10. The second direction Y intersects the third direction Z on a same horizontal plane, where the second direction Y may intersect the third direction Z at a predetermined angle, for example, the second direction Y is mutually perpendicular to the third direction Z.

In a process of forming the word line isolation trench 50 on the substrate 10, a mask layer with a mask pattern can be first formed on the substrate 10, the direction from the top surface of the substrate 10 to the bottom surface of the substrate 10 is taken as an extension direction, and along the extension direction, a part of the substrate 10 is removed based on the mask pattern to form the word line isolation trenches 50 disposed at intervals along the third direction Z.

The bit line isolation trenches 30 and the word line isolation trenches 50 are formed on the substrate 10, such that the silicon pillars 20 arranged in the plurality of rows and plurality of columns are formed on the substrate 10. The word line isolation trench 50 and the bit line isolation trench 30 facilitate subsequent formation of other functional layers of a semiconductor structure on the substrate 10, and the process of forming the silicon pillar 20 is simple, which facilitates control of a size of the subsequently formed active pillar 60.

It should be noted that, in some embodiments, the silicon pillar 20 may alternatively be formed on the top surface of the substrate 10 by a silicon epitaxial growth process, or by depositing a multi-layer functional layer on the top surface of the substrate 10, and a part of the functional layer is removed through etching, such that the silicon pillars 20 arranged in the plurality of rows and plurality of columns are formed on the substrate 10.

According to an exemplary embodiment, this embodiment is a further description of step S300 described above.

Figure 4:
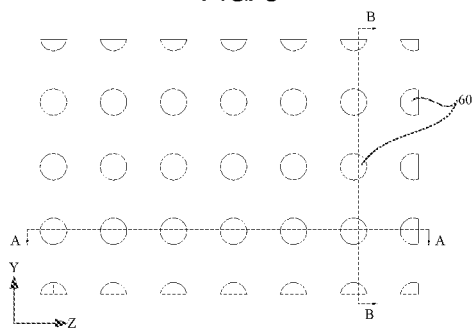
FIG. 4 is a top view of forming an active pillar in a manufacturing method of a semiconductor structure according to an exemplary embodiment.
Figure 5:
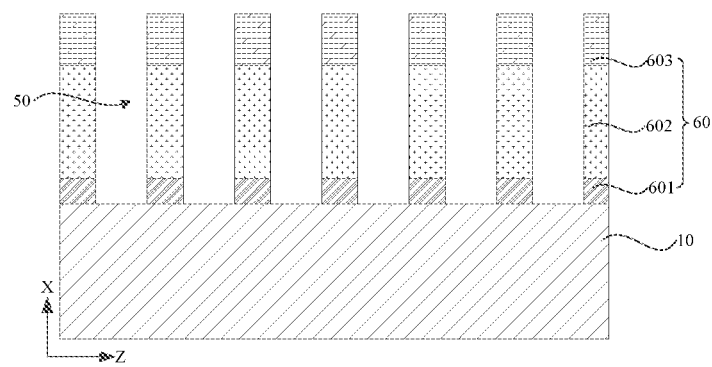
FIG. 5 is a sectional view of forming a word line isolation trench along a direction A-A in FIG. 4.
Figure 6:
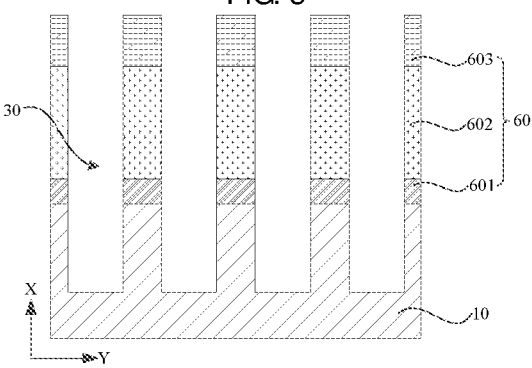
FIG. 6 is a sectional view of forming a bit line isolation trench along a direction B-B in FIG. 4.

As shown in FIG. 4 to FIG. 6, the silicon pillar 20 is preprocessed to form the active pillar 60.

The preprocessing includes oxidation processing. That is, the silicon pillar 20 is etched or cleaned after the oxidization processing, such that the silicon pillar 20 forms the active pillar 60. Edges and corners of the silicon pillar 20 are passivated through the oxidation processing, such that the cross-sectional shape of the silicon pillar 20 changes from the square to a circle or an ellipse. It should be noted that in some embodiments, the oxidation processing includes thermal oxidation or steam oxidation. In the oxidation processing, the silicon pillar 20 is exposed to the outside. Through thermal oxidation or steam oxidation, an oxide layer, such as monox, is formed on a surface of the silicon pillar 20, and then the oxide layer can be removed through etching or cleaning, so as to passivate the edges and the corners of the silicon pillar 20.

After the oxidization processing is completed for the silicon pillar 20, an ion implantation process is performed on the silicon pillar 20 with a circular or elliptical cross-section to form the active pillar 60. As an example, the method of processing the silicon pillar 20 by the ion implantation process, to form a drain and a source of the subsequent active pillar 60 is known to those skilled in the art, and details are not described herein again. It should be noted that the silicon pillar 20 processed by the ion implantation process forms the active pillar 60 in this step. Along the first direction X, the active pillar 60 includes the first segment 601, the second segment 602, and the third segment 603 that are sequentially connected, and a bottom surface of the first segment 601 is connected to the substrate 10. The first segment 601 can form the source or the drain, the second segment 602 can form a gate, and the third segment 603 can form the source or the drain. In this embodiment, the first segment 601 forms the drain, and the third segment 603 forms the source.

In this embodiment, the edges and the corners of the silicon pillar 20 are passivated through the oxidation processing, which can improve an adhesion capability of the subsequent active pillar 60, such that the subsequently formed functional layers such as a dielectric layer, a word line, and a bit line can be well connected to the active pillar 60, thereby improving performance and a yield of the semiconductor structure.

Figure 12:
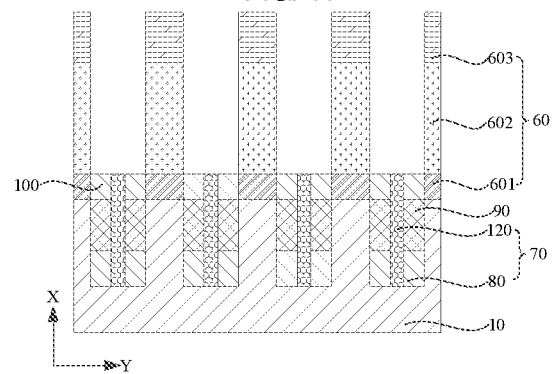
FIG. 12 is a schematic diagram of forming a second dielectric layer and a bit line isolation structure along a direction Y in a manufacturing method of a semiconductor structure according to an exemplary embodiment.

As shown in FIG. 12, in some embodiments, after the oxidation processing is performed on the silicon pillar 20 and the active pillar 60 is formed, in order to facilitate subsequent formation of a plurality of bit lines disposed at intervals along the second direction Y in the substrate 10 and realize insulation between adjacent ones of the bit lines, a bit line isolation structure 70 can be formed in the substrate 10.

Figure 7:
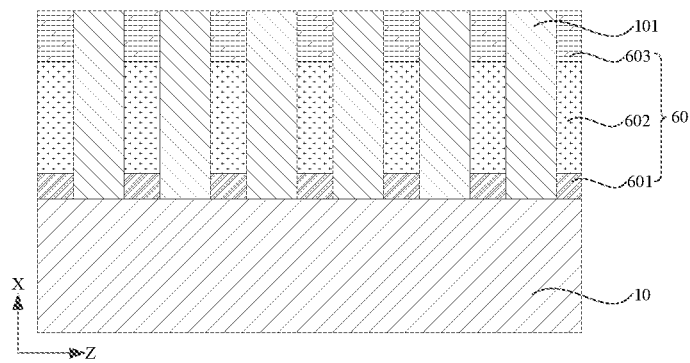
FIG. 7 is a schematic diagram of forming a second initial dielectric layer along a direction Z in a manufacturing method of a semiconductor structure according to an exemplary embodiment.
Figure 8:
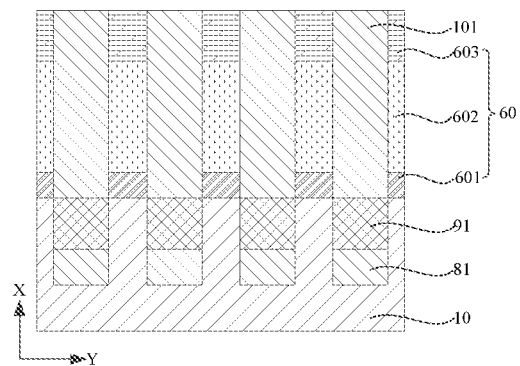
FIG. 8 is a schematic diagram of forming a second initial dielectric layer, an initial word line, and a first initial dielectric layer along a direction Y in a manufacturing method of a semiconductor structure according to an exemplary embodiment.

In some embodiments, the bit line isolation structure 70 may be formed by the following method:

At first, referring to FIG. 7 and FIG. 8, a first initial dielectric layer 81, an initial bit line 91, and a second initial dielectric layer 101 that are stacked are successively formed in the bit line isolation trench 30 and the word line isolation trench 50.

A first sacrificial dielectric layer (not shown in the figure) can be deposited in the bit line isolation trench 30 and the word line isolation trench 50 by an ALD process, a physical vapor deposition (PVD) process, or a chemical vapor deposition (CVD) process. The first sacrificial dielectric layer fills the bit line isolation trench 30 and the word line isolation trench 50. Along the first direction X, a part of the first sacrificial dielectric layer is removed through etching, and the reserved first sacrificial dielectric layer forms the first initial dielectric layer 81. A top surface of the first initial dielectric layer 81 is lower than a bottom surface of the word line isolation trench 50.

After the first initial dielectric layer 81 is formed, a first bit line (not shown in the figure) is formed on the first initial dielectric layer 81 by the ALD process, the PVD process, or the CVD process. A top surface of the first bit line is flush with that of the bit line isolation trench 30. Along the first direction X, a part of the first bit line is removed through etching, where an etching endpoint of the first bit line is flush with the bottom surface of the word line isolation trench 50. The reserved first bit line forms the initial bit line 91, in other words, the initial bit line 91 is only filled in the bit line isolation trench 30.

After the initial bit line 91 is formed, the second initial dielectric layer 101 is formed on the initial bit line 91 by the ALD process, the PVD process, or the CVD process. A top surface of the second initial dielectric layer 101 is flush with that of the bit line isolation trench 30.

Figure 9:
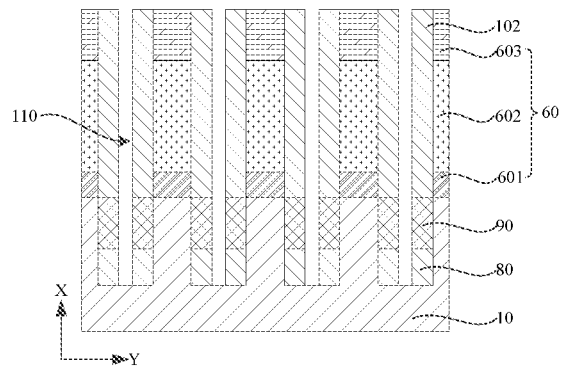
FIG. 9 is a schematic diagram of forming a second intermediate dielectric layer, a word line, a first dielectric layer, and a first trench along a direction Y in a manufacturing method of a semiconductor structure according to an exemplary embodiment.

After that, referring to FIG. 9, a part of the second initial dielectric layer 101, a part of the initial bit line 91, and a part of the first initial dielectric layer 81 are removed through etching along the first direction X to form a plurality of first trenches 110 disposed at intervals along the second direction Y. The reserved first initial dielectric layer 81 forms a first dielectric layer 80, the reserved initial bit line 91 forms a bit line 90, and the reserved second initial dielectric layer 101 forms a second intermediate dielectric layer 102. A material of the first dielectric layer 80 includes, but is not limited to, silicon nitride, silicon dioxide, or silicon oxynitride. A material of the bit line 90 includes, but is not limited to, cobalt silicide (CoSi) or platinum nickel silicide (PtNiSi).

Figure 10:
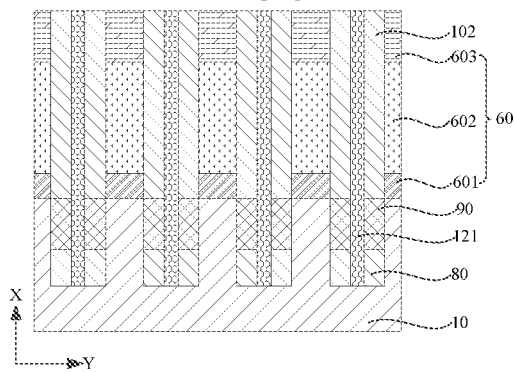
FIG. 10 is a schematic diagram of forming a first initial isolation layer along a direction Y in a manufacturing method of a semiconductor structure according to an exemplary embodiment.

Then, referring to FIG. 10, a first initial isolation layer 121 is formed in the first trench 110 by the ALD process, the PVD process, or the CVD process.

Figure 11:
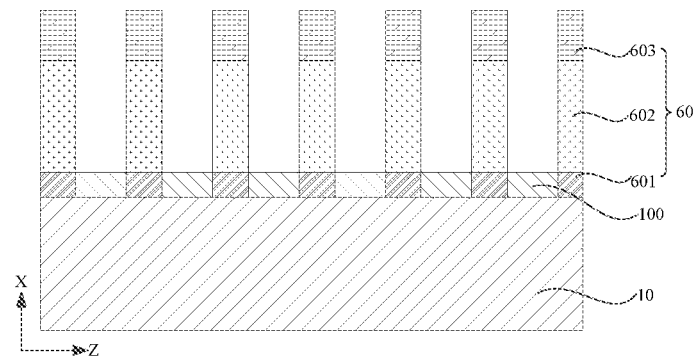
FIG. 11 is a schematic diagram of forming a second dielectric layer along a direction Z in a manufacturing method of a semiconductor structure according to an exemplary embodiment.

Finally, referring to FIG. 11 and FIG. 12, a part of the second intermediate dielectric layer 102 and a part of the first initial isolation layer 121 are removed through etching along the first direction X. It should be noted that etching endpoints of the second intermediate dielectric layer 102 and the first initial isolation layer 121 may be flush with a junction between the second segment 602 and the first segment 601 of the active pillar 60. The reserved second intermediate dielectric layer 102 forms a second dielectric layer 100. The reserved first initial isolation layer 121 forms a first isolation layer 120.

A material of the second dielectric layer 100 includes, but is not limited to, silicon nitride, silicon dioxide, or silicon oxynitride. It should be noted that in an embodiment, a material of the first dielectric layer 80 may be the same as that of the second dielectric layer 100 to reduce process complexity and process costs.

A material of the first isolation layer 120 includes, but is not limited to, monox or silicon nitride. In this embodiment, the first dielectric layer 80 and the first isolation layer 120 form the bit line isolation structure 70.

In some embodiments, the bit line isolation structure 70 may alternatively be an oxide-nitride-oxide (ONO) structure, but is not limited thereto.

The bit line isolation structure 70 formed in the substrate 10 can realize an insulation effect between adjacent bit lines 90, and ensure the performance and the yield of the semiconductor structure.

In addition, the bit line forming method in this embodiment is simple and easy to control and operate. It should be noted that the bit line can be connected to the drain of the subsequently formed active pillar 60. In a transistor, a gate is connected to a word line, and a source is connected to a capacitor structure. A voltage signal on the word line controls the transistor to turn on or off, and then data information stored in the capacitor structure is read through the bit line, or data information is written into the capacitor structure through the bit line for storage.

According to an exemplary embodiment, this embodiment is a further description of step S400 described above.

Figure 13:
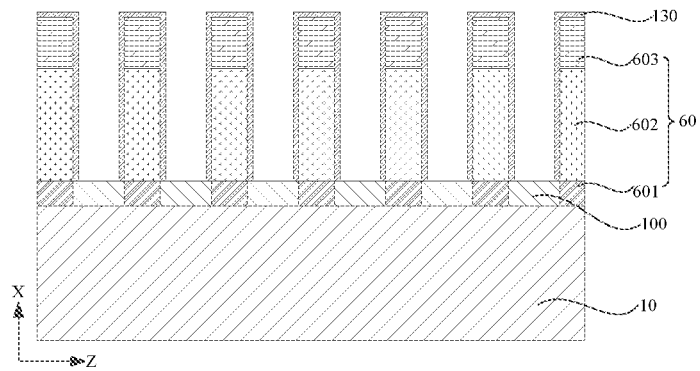
FIG. 13 is a schematic diagram of forming a first gate oxide layer along a direction Z in a manufacturing method of a semiconductor structure according to an exemplary embodiment.
Figure 14:
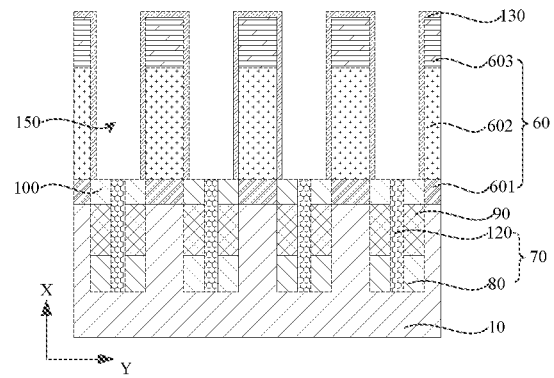
FIG. 14 is a schematic diagram of forming a first gate oxide layer along a direction Y in a manufacturing method of a semiconductor structure according to an exemplary embodiment.

As shown in FIG. 13 and FIG. 14, the first gate oxide layer 130 is formed on the sidewalls of the second segment 602 and the third segment 603 of the active pillar 60.

After the bit line isolation structure 70 is formed, the first gate oxide layer 130 is formed on the sidewall of the second segment 602 and on the sidewall and the top surface of the third segment 603 of the active pillar 60 by the ALD process.

In some embodiments, a first initial gate oxide layer (not shown in the figure) may be formed on the second segment 602 and the third segment 603 of the active pillar 60 by the ALD process. The first initial gate oxide layer is formed on the sidewall of the second segment 602, the sidewall and the top surface of the third segment 603, and top surfaces of the second dielectric layer 100 and the bit line isolation structure 70. Then, the first initial gate oxide layer on the top surfaces of the second dielectric layer 100 and the bit line isolation structure 70 is removed through etching, and the first initial gate oxide layer on the sidewall of the second segment 602 and the sidewall and the top surface of the third segment 603 is reserved. The reserved first initial gate oxide layer forms the first gate oxide layer 130. A material of the first gate oxide layer 130 may include, but is not limited to, silicon dioxide, silicon monoxide, hafnium oxide, or titanium oxide.

In this embodiment, the ALD process is characterized by a low deposition rate, high density of a deposited film layer, and good step coverage. The ALD process is used to form a relatively thin first gate oxide layer 130, which can effectively isolate and protect the second segment 602, namely, the gate, of the active pillar, and can avoid occupying large space, thereby facilitating subsequent filling or formation of another structure layer.

According to an exemplary embodiment, this embodiment is a further description of step S500 described above.

Figure 19:
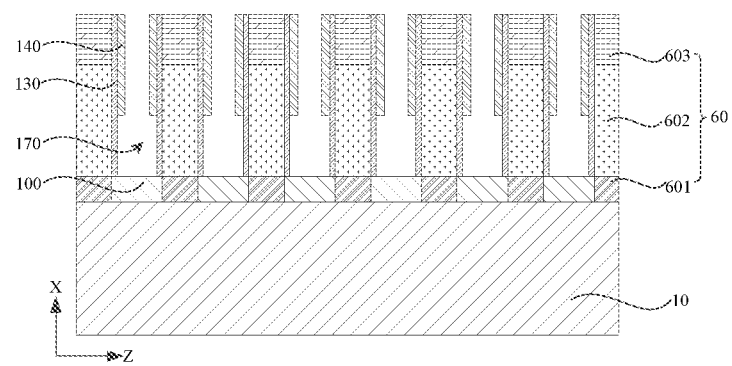
FIG. 19 is a schematic diagram of forming a second trench along a direction Z in a manufacturing method of a semiconductor structure according to an exemplary embodiment.
Figure 20:
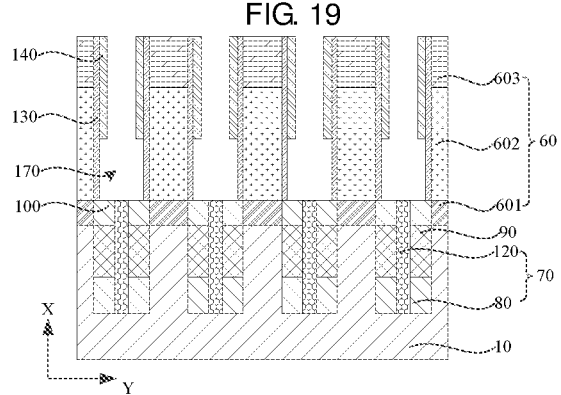
FIG. 20 is a schematic diagram of forming a second trench along a direction Y in a manufacturing method of a semiconductor structure according to an exemplary embodiment.

As shown in FIG. 19 and FIG. 20, the second gate oxide layer 140 is formed on the first gate oxide layer 130. Along the first direction X, the length of the second gate oxide layer 140 is less than that of the first gate oxide layer 130, the top surface of the second gate oxide layer 140 is flush with that of the third segment 603, and the thickness of the second gate oxide layer 140 is greater than that of the first gate oxide layer 130.

In some embodiments, the second gate oxide layer 140 may be formed by the following method:

At first, referring to FIG. 14, after the first gate oxide layer 130 is formed, a filling region 150 is formed between the top surface of the second dielectric layer 100 and a sidewall of the first gate oxide layer 130.

Figure 15:
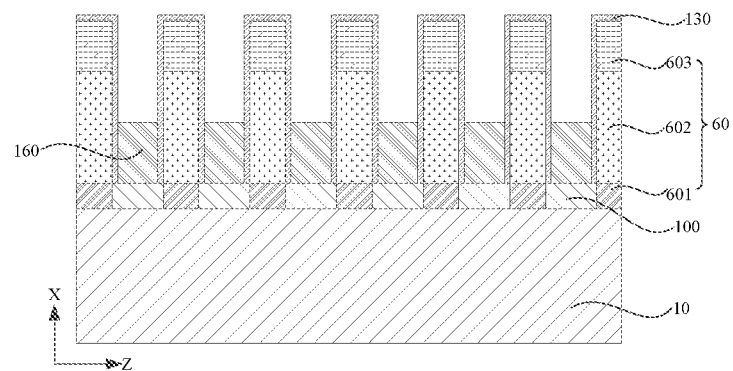
FIG. 15 is a schematic diagram of forming a sacrificial layer along a direction Z in a manufacturing method of a semiconductor structure according to an exemplary embodiment.
Figure 16:
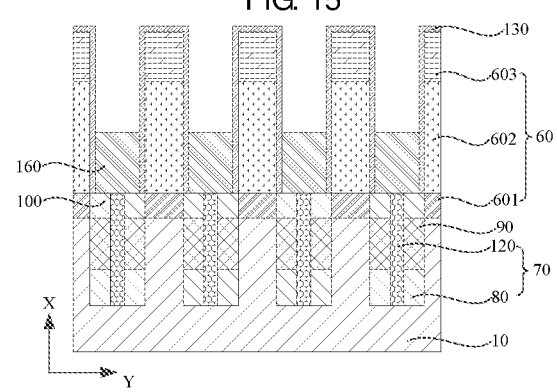
FIG. 16 is a schematic diagram of forming a sacrificial layer along a direction Yin a manufacturing method of a semiconductor structure according to an exemplary embodiment.

Referring to FIG. 15 and FIG. 16, an initial sacrificial layer (not shown in the figure) is formed in the filling region 150 by the ALD process, the PVD process, or the CVD process. The initial sacrificial layer fills the filling region 150. After that, a part of the initial sacrificial layer is removed through etching, where an etching endpoint of the initial sacrificial layer is flush with a preset position of the second segment 602. The reserved initial sacrificial layer forms a sacrificial layer 160. In this step, the preset position of the second segment 602 may be one-third to two-thirds of a height of the second segment 602. In an embodiment, the preset position of the second segment 602 is a half of the height of the second segment 602. In this embodiment, along the first direction X, a part that is of the second segment 602 and corresponds to a height of the sacrificial layer 160 forms a first sub-segment, and a remaining part that is of the second segment 602 and does not correspond to the sacrificial layer 160 forms a second sub-segment, such that the subsequently formed second gate oxide layer 140 forms gate oxide layers with different thicknesses at different positions of the second segment 602.

Figure 17:
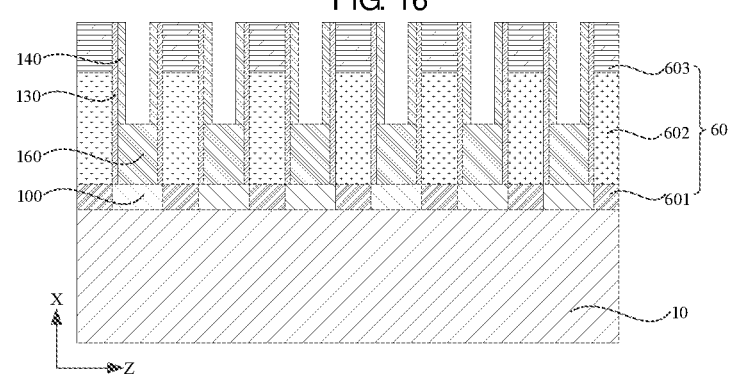
FIG. 17 is a schematic diagram of forming a second gate oxide layer along a direction Z in a manufacturing method of a semiconductor structure according to an exemplary embodiment.
Figure 18:
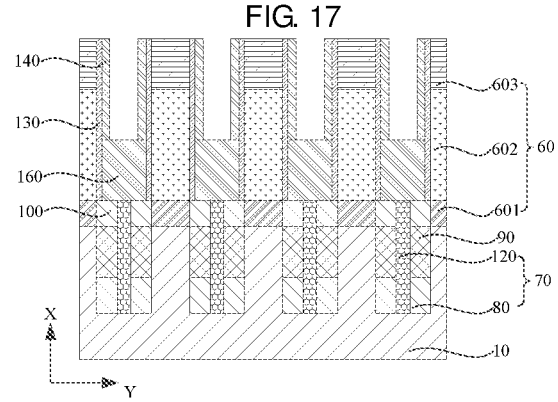
FIG. 18 is a schematic diagram of forming a second gate oxide layer along a direction Y in a manufacturing method of a semiconductor structure according to an exemplary embodiment.

After that, as shown in FIG. 17 and FIG. 18, the first gate oxide layer 130 located on the top of the third segment 603 is removed through chemical mechanical polishing or etching, to expose the top surface of the active pillar 60.

Still referring to FIG. 17 and FIG. 18, the second gate oxide layer 140 is formed on a part of the sidewall of the second segment 602 and on the sidewall of the third segment 603, in other words, the second gate oxide layer 140 is disposed on an outer side of a part that is of the first gate oxide layer 130 and corresponds to the second sub-segment and on an outer side of the first gate oxide layer 130 on the sidewall of the third segment 603. A bottom surface of the second gate oxide layer 140 is connected to a top surface of the sacrificial layer 160.

In some embodiments, the second gate oxide layer 140 may be formed on a sidewall of the second sub-segment of the second segment 602 and the sidewall of the third segment 603 by the ALD process.

Finally, referring to FIG. 19 and FIG. 20, the sacrificial layer 160 is removed through etching. A sidewall of the second gate oxide layer 140 and a sidewall of the first gate oxide layer 130 originally covered by the sacrificial layer 160 form a second trench 170.

In this embodiment, the ALD process is used to form the second gate oxide layer 140 on the second sub-segment of the second segment 602 and the sidewall of the first gate oxide layer 130 corresponding to the third segment 603. A material of the second gate oxide layer 140 may include, but is not limited to, silicon dioxide, silicon monoxide, hafnium oxide, or titanium oxide. The second gate oxide layer 140 and the first gate oxide layer 130 may be made of a same material or different materials.

Before the second gate oxide layer 140 is formed, the sacrificial layer 160 is formed in the filling region 150, and the sacrificial layer 160 covers a part of the second segment 602, such that the length of the second gate oxide layer 140 in the first direction X is less than that of the first gate oxide layer 130. In addition, in a process of forming the second gate oxide layer 140, the thickness of the second gate oxide layer 140 is controlled to be greater than that of the first gate oxide layer 130.

In the semiconductor structure, a GIDL current exists in a GAA transistor. The reason for this kind of transistor to generate the GIDL current is that a thickness of a gate oxide layer is small, which reduces a charge storage capability of the gate oxide layer. When the GAA transistor is in a static state, electrons generated by a gate or a small quantity of carrier fluids enter a drain of the transistor through the gate oxide layer, which causes a high electric field effect to the drain of the transistor, resulting in a leakage current at the drain. In this embodiment, the first gate oxide layer 130 and the second gate oxide layer 140 are successively formed on the sidewall of the second segment 602 of the active pillar 60, such that the thicknesses of the gate oxide layers at different positions on the second segment 602 are different. This improves the charge storage capability of the gate oxide layer, prevents the electrons generated by the gate in the semiconductor structure or the small quantity of carrier fluids from entering the source or the drain of the semiconductor structure through the gate oxide layer, and reduces the GIDL current, thereby improving the performance and the yield of the semiconductor structure.

Figure 28:
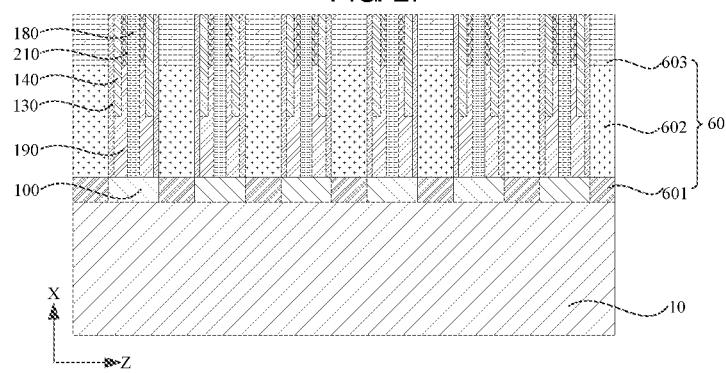
FIG. 28 is a schematic diagram of forming a word line isolation structure along a direction Z in a manufacturing method of a semiconductor structure according to an exemplary embodiment.

As shown in FIG. 28, after the second gate oxide layer 140 is formed, a word line isolation structure 180 can further be formed in the second trench 170. There are a plurality of word line isolation structures 180 that are disposed at intervals along the third direction Z.

Figure 21:
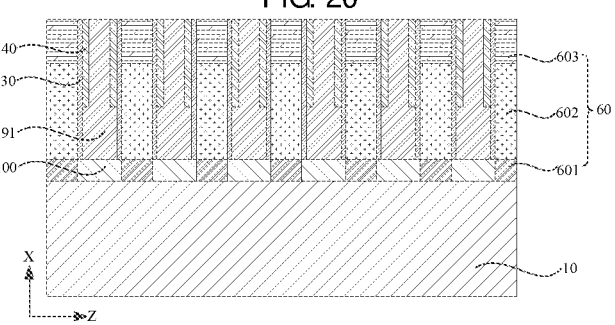
FIG. 21 is a schematic diagram of forming an initial word line along a direction Z in a manufacturing method of a semiconductor structure according to an exemplary embodiment.
Figure 22:
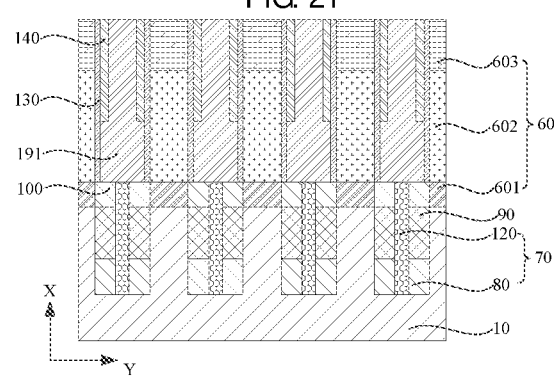
FIG. 22 is a schematic diagram of forming an initial word line along a direction Y in a manufacturing method of a semiconductor structure according to an exemplary embodiment.

In some embodiments, the word line isolation structure 180 may be formed by the following method:

Referring to FIG. 21 and FIG. 22, an initial word line 191 is formed in the second trench 170 by the ALD process, the PVD process, or the CVD process. The initial word line 191 fills the second trench 170. There are a plurality of initial word lines 191 that are disposed at intervals along the third direction Z.

Figure 23:
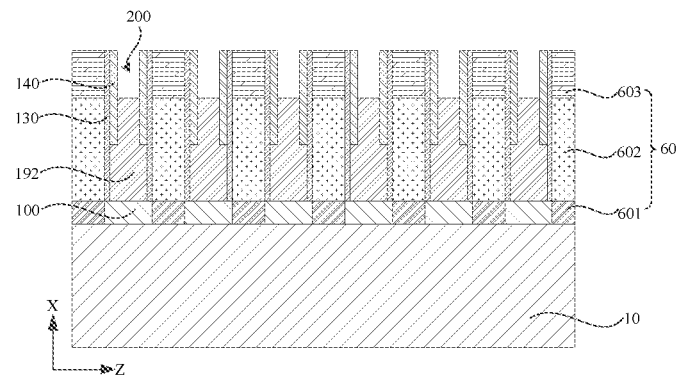
FIG. 23 is a schematic diagram of forming an intermediate word line along a direction Z in a manufacturing method of a semiconductor structure according to an exemplary embodiment.
Figure 24:
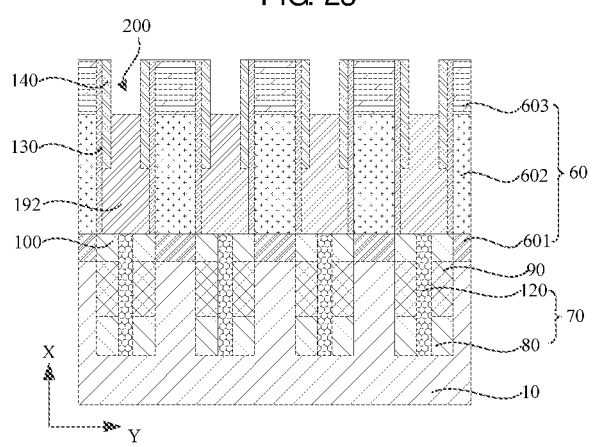
FIG. 24 is a schematic diagram of forming an intermediate word line along a direction Y in a manufacturing method of a semiconductor structure according to an exemplary embodiment.

Referring to FIG. 23 and FIG. 24, a part of the initial word line 191 is removed through etching along the first direction X. An etching endpoint of the initial word line 191 is flush with a junction between the second segment 602 and the third segment 603. The reserved initial word line 191 forms an intermediate word line 192. A third trench 200 is formed between the intermediate word line 192 and the sidewall of the second gate oxide layer 140.

Figure 25:
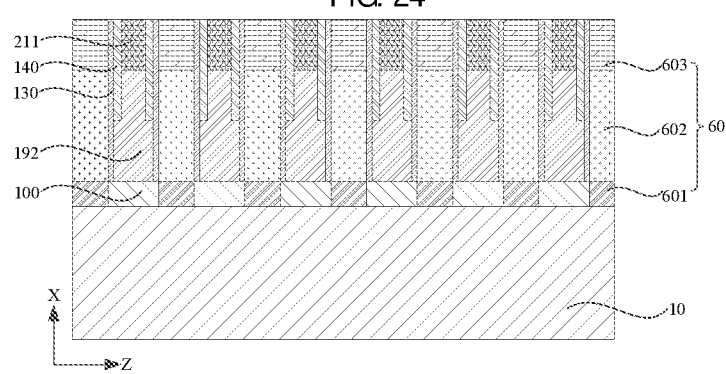
FIG. 25 is a schematic diagram of forming a third initial dielectric layer along a direction Z in a manufacturing method of a semiconductor structure according to an exemplary embodiment.
Figure 26:
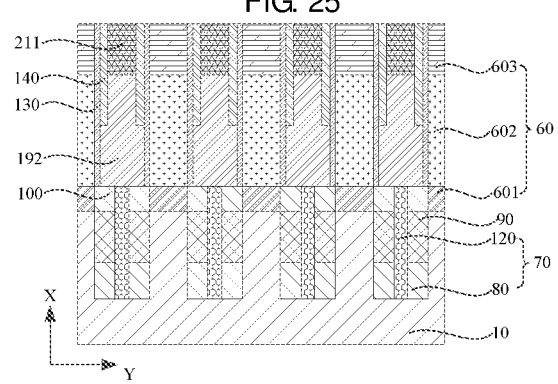
FIG. 26 is a schematic diagram of forming a third initial dielectric layer along a direction Y in a manufacturing method of a semiconductor structure according to an exemplary embodiment.

Referring to FIG. 25 and FIG. 26, a third initial dielectric layer 211 is formed in the third trench 200 by the ALD process, the PVD process, or the CVD process.

Figure 27:
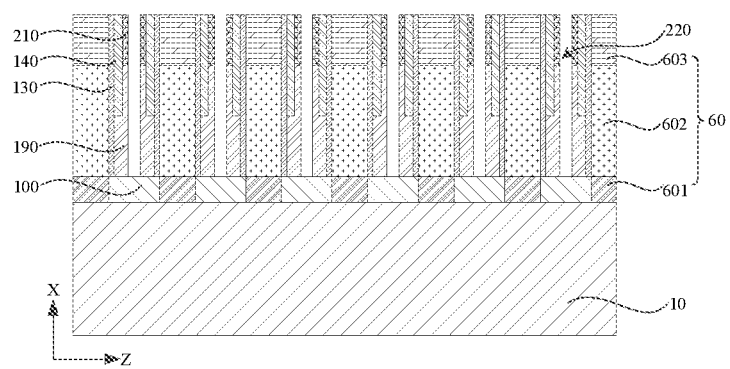
FIG. 27 is a schematic diagram of forming a third dielectric layer and a fourth trench along a direction Z in a manufacturing method of a semiconductor structure according to an exemplary embodiment.

As shown in FIG. 27, a part of the third initial dielectric layer 211 and a part of the intermediate word line 192 are removed through etching along the first direction X to form a plurality of fourth trenches 220 disposed at intervals along the third direction Z. A bottom of the fourth trench 220 exposes the top surface of the second dielectric layer 100. The reserved third initial dielectric layer 211 forms a third dielectric layer 210. The reserved intermediate word line 192 forms two word lines 190 disposed at intervals. A material of the third dielectric layer 210 includes, but is not limited to, silicon nitride, silicon dioxide, or silicon oxynitride. A material of the word line 190 includes, but is not limited to, tungsten or polycrystalline silicon. It should be noted that a thickness of a word line made of a material such as tungsten or polycrystalline silicon does not affect a potential of the word line.

As shown in FIG. 28, the word line isolation structure 180 is formed in the fourth trench 220 by the ALD process, the PVD process, or the CVD process. A material of the word line isolation structure 180 includes a nitride, an oxide, a high-k dielectric material, or another suitable insulating material.

In some embodiments, a gate structure with dual work functions is generally obtained by depositing word line metal layers of different materials at the gate, but a process required for depositing the metal layers of different materials is relatively complex, and an isolation layer is required between the metal layers of different materials due to a diffusion problem.

In this embodiment, the word line 190 is formed by one deposition process and is made of metallic tungsten or polycrystalline silicon. In addition, the first gate oxide layer 130 is formed on the sidewalls of the second segment 602 and the third segment 603, and then the second gate oxide layer 140 is formed on the first gate oxide layer 130 on the sidewall corresponding to the second sub-segment of the second segment 602 and on the sidewall corresponding to the third segment 603, such that the thicknesses of the gate oxide layers at different positions of the segment section 602 are different, so as to achieve an effect of the dual work functions. This is not only simple in processing technology, but also is easier to control and realize. A thickness of a gate oxide layer that is of the second segment 602 and close to the third segment 603 is greater than that of a gate oxide layer that is of the second segment 602 and close to the first segment 601. Therefore, when the transistor formed by the semiconductor structure in this embodiment, such as the GAA transistor, is used, a thickness of a gate oxide layer that is of the gate and close to the source increases. In order to turn on the transistor, an additional turn-on voltage VT of a source terminal increases, which correspondingly increases a potential of a part that is of the word line 190 and close to the third segment 603, thereby forming a potential difference between the word lines 190 at two ends of the second segment 602.

Further, when the additional turn-on voltage VT of the source terminal increases, a source voltage Vs of the source terminal increases. A relationship shown in the following formula exists between the turn-off current (I off) and the source voltage Vs, namely:

$$I\ \text{off} \propto e^{-(Vs*\varepsilon/kt)}$$

In the above formula, ε/kt represents a constant, which is about 0.0256. Therefore, when the source voltage Vs of the source terminal increases, the turn-off current (I off) decreases. Since the turn-off current and the source voltage Vs meet an exponential relationship of e, when the thickness of the gate oxide layer of the source terminal of the transistor increases, the turn-off current decreases exponentially, so as to facilitate the control of the turn-off current of the semiconductor structure, thereby reducing the GIDL current and interband tunneling of the semiconductor structure and improving the performance and the yield of the semiconductor structure.

Referring to FIG. 28, in some embodiments, the thickness of the second gate oxide layer 140 is 1 to 2 times that of the first gate oxide layer 130. Therefore, in this embodiment, the thickness of the gate oxide layer that is of the second segment 602 and close to the third segment 603 is 2 to 3 times that of the gate oxide layer that is of the second segment 602 and close to the first segment 601. In a specific embodiment, the thickness of the second gate oxide layer 140 is 1.5 times that of the first gate oxide layer 130. The above thickness ratio is set, such that the turn-off current of the semiconductor structure can be reduced by 6 orders of magnitude. In addition, the GIDL current and interband tunneling of the semiconductor structure are also reduced, thereby improving the performance and the yield of the semiconductor structure.

As shown in FIG. 26 and FIG. 28, an exemplary embodiment of the present disclosure provides a semiconductor structure. The semiconductor structure includes a substrate 10, an active pillar 60, a first gate oxide layer 130, and a second gate oxide layer 140.

For example, there are a plurality of active pillars 60 that are arranged as an array in the substrate 10. Along a first direction X, the active pillar 60 includes a first segment 601, a second segment 602, and a third segment 603 that are sequentially connected.

The first gate oxide layer 130 covers sidewalls of the second segment 602 and the third segment 603.

The second gate oxide layer 140 is disposed on an outer side of the first gate oxide layer 130. Along the first direction X, a length of the second gate oxide layer 140 is less than that of the first gate oxide layer 130. A top surface of the second gate oxide layer 140 is flush with that of the third segment 603. A thickness of the second gate oxide layer 140 is greater than that of the first gate oxide layer 130. In some embodiments, the thickness of the second gate oxide layer 140 is 1 to 2 times that of the first gate oxide layer 130.

In this embodiment, the first gate oxide layer is formed on the sidewalls of the second segment and the third segment of the active pillar, and the second gate oxide layer is formed on the first gate oxide layer, so as to increase a thickness of a gate oxide layer of the active pillar and a charge storage capability of the gate oxide layer, and effectively reduce a GIDL current and interband tunneling. In addition, the length of the second gate oxide layer is less than that of the first gate oxide layer, the thickness of the second gate oxide layer is greater than that of the first gate oxide layer, and the top surface of the second gate oxide layer is flush with that of the third segment, such that two gate oxide layers with different thickness are formed at different positions of the second segment, and a thickness of a gate oxide layer formed on the third segment is the same as that of the thicker gate oxide layer on the second segment, to make potentials at both ends of the second segment different. This is conducive to controlling a turn-off current of the semiconductor structure and effectively improving performance and a yield of the semiconductor structure.

As shown in FIG. 26, in some embodiments, the semiconductor structure further includes a plurality of bit lines 90 disposed on the substrate 10. The bit lines 90 are disposed at intervals along a second direction Y, and are located below the active pillars 60. The bit line 90 is connected to first segments 601 of a plurality of active pillars 60 that are along a third direction Z and in a same straight line. A top surface of the bit line 90 is provided with a second dielectric layer 100.

As shown in FIG. 26, in some embodiments, the semiconductor structure further includes a plurality of bit line isolation structures 70 disposed on the substrate 10. The bit line isolation structures 70 are disposed at intervals along the second direction Y. The bit line isolation structure 70 includes a first dielectric layer 80 and a first isolation layer 120. The first dielectric layer 80 is located between the substrate 10 and the bit line 90. The first isolation layer 120 is located between adjacent bit lines 90. The bit line isolation is structure 70 is used to realize insulation between adjacent bit lines 90 subsequently formed in the substrate 10, and ensure the performance and the yield of the semiconductor structure.

As shown in FIG. 28, in some embodiments, the semiconductor structure further includes word lines 190 disposed in the substrate 10. Each of the word lines 190 is disposed around the second segment 602 of the active pillar 60. The word lines 190 include a first word line and a second line, a bottom surface of the first word line is close to the first segment 601, and a top surface of the second word line is close to the third segment 603. With a plane perpendicular to the second direction Y as a longitudinal section, area of a longitudinal section of the first word line is greater than that of a longitudinal section of the second word line. It should be noted that a junction between the first word line and the second word line may be flush with a bottom surface of the second gate oxide layer 140.

The first word line and the second word line may be formed by one deposition process or by a plurality of deposition processes. In some embodiments, the first word line and the second word line are made of a same material.

As shown in FIG. 28, in some embodiments, the semiconductor structure further includes a plurality of word line isolation structures 180 disposed in the substrate 10. The word line isolation structure 180 is located between adjacent word lines 190, a top surface of the word line 190 is provided with a third dielectric layer 210, and a top surface of the third dielectric layer 210 is flush with a top surface of the active pillar 60. The word line isolation structure 180 is used to realize insulation between adjacent word lines 190, and ensure the performance and the yield of the semiconductor structure.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the manufacturing method of a semiconductor structure and the semiconductor structure provided in the embodiments of the present disclosure, two gate oxide layers with different thicknesses are formed at different positions on a second segment of an active pillar, and a thickness of a gate oxide layer formed on a third segment is the same as that of the thicker gate oxide layer on the second segment, to effectively reduce a GIDL current, and improve performance and a field of the semiconductor structure.

The invention claimed is:
1. A manufacturing method of a semiconductor structure, comprising:
  providing a substrate;
  forming a plurality of silicon pillars on the substrate, wherein the silicon pillars are arranged as an array;
  preprocessing the silicon pillar to form an active pillar, wherein along a first direction, the active pillar comprises a first segment, a second segment, and a third segment that are sequentially connected;
  forming a first gate oxide layer on sidewalls of the second segment and the third segment; and
  forming a second gate oxide layer on the first gate oxide layer, wherein along the first direction, a length of the second gate oxide layer is less than that of the first gate oxide layer, a top surface of the second gate oxide layer is flush with that of the third segment, and a thickness of the second gate oxide layer is greater than that of the first gate oxide layer.

2. The manufacturing method of a semiconductor structure according to claim 1, wherein the thickness of the second gate oxide layer is 1 to 2 times that of the first gate oxide layer.

3. The manufacturing method of a semiconductor structure according to claim 1, wherein with a plane perpendicular to the first direction as a cross section, a cross-sectional shape of the silicon pillar comprises a square; and
the preprocessing the silicon pillar to form an active pillar comprises:
oxidizing the silicon pillar to form the active pillar, wherein a cross-sectional shape of the active pillar comprises a circle and/or an ellipse.

4. The manufacturing method of a semiconductor structure according to claim 1, wherein the forming a plurality of silicon pillars on the substrate comprises:
forming a plurality of bit line isolation trenches in the substrate, wherein the bit line isolation trenches are disposed at intervals along a second direction, and the substrate between adjacent ones of the bit line isolation trenches constitutes a strip body; and
forming a plurality of word line isolation trenches in the substrate, wherein the word line isolation trenches are disposed at intervals along a third direction to separate the strip body into the silicon pillars, and along the first direction, a depth of each of the word line isolation trenches is less than that of each of the bit line isolation trenches.

5. The manufacturing method of a semiconductor structure according to claim 4, the manufacturing method further comprises:
forming a plurality of bit line isolation structures in the substrate, wherein the plurality of bit line isolation structures are disposed at intervals along the second direction.

6. The manufacturing method of a semiconductor structure according to claim 5, wherein the forming a plurality of bit line isolation structures in the substrate comprises:
forming, in the bit line isolation trench and the word line isolation trench, a first initial dielectric layer, an initial bit line, and a second initial dielectric layer that are stacked;
removing a part of the second initial dielectric layer, a part of the initial bit line, and a part of the first initial dielectric layer along the first direction to form a first trench, such that the reserved second initial dielectric layer forms a second intermediate dielectric layer, the reserved initial bit line forms a bit line, and the reserved first initial dielectric layer forms a first dielectric layer;
forming a first initial isolation layer in the first trench; and
removing a part of the second intermediate dielectric layer and a part of the first initial isolation layer, such that the reserved second intermediate dielectric layer forms a second dielectric layer and the reserved first initial isolation layer forms a first isolation layer; wherein
the first isolation layer and the first dielectric layer form each of the bit line isolation structures, and a junction between the first segment and the second segment of the active pillar is flush with a top surface of the second dielectric layer.

7. The manufacturing method of a semiconductor structure according to claim 6, wherein the forming a first gate oxide layer on sidewalls of the second segment and the third segment comprises:
forming the first gate oxide layer on the sidewalls of the second segment and the third segment by an atomic layer deposition (ALD) process, wherein a filling region is formed between the top surface of the second dielectric layer and a sidewall of the first gate oxide layer.

8. The manufacturing method of a semiconductor structure according to claim 7, wherein the forming a second gate oxide layer on the first gate oxide layer comprises:
forming a sacrificial layer in the filling region, wherein a top surface of the sacrificial layer is flush with a preset position of the second segment;
removing a part of the first gate oxide layer to expose a top surface of the active pillar;
forming the second gate oxide layer, wherein a bottom surface of the second gate oxide layer is connected to the top surface of the sacrificial layer, and the second gate oxide layer is located on an outer side of the first gate oxide layer covering partial sidewalls of the second segment and the third segment; and
removing the sacrificial layer, such that a sidewall of the second gate oxide layer and the sidewall of the first gate oxide layer originally covered by the sacrificial layer form a second trench.

9. The manufacturing method of a semiconductor structure according to claim 8, wherein the forming the second gate oxide layer comprises:
forming the second gate oxide layer by the ALD process.

10. The manufacturing method of a semiconductor structure according to claim 8, the manufacturing method further comprises:
forming a word line isolation structure in the second trench, wherein a plurality of word line isolation structures are disposed at intervals along the third direction.

11. The manufacturing method of a semiconductor structure according to claim 10, wherein the forming a word line isolation structure in the second trench comprises:
forming an initial word line in the second trench, wherein a plurality of initial word lines are disposed at intervals along the third direction;
removing a part of the initial word line along the first direction, such that the reserved initial word line forms an intermediate word line, and a third trench is formed between the intermediate word line and the sidewall of the second gate oxide layer;
forming a third initial dielectric layer in the third trench;
removing a part of the third initial dielectric layer and a part of the intermediate word line along the first direction to form a fourth trench, a plurality of the fourth trenches are disposed at intervals along the third direction, such that a bottom of the fourth trench exposes the top surface of the second dielectric layer, the reserved third initial dielectric layer forms a third dielectric layer, and the reserved intermediate word line forms two word lines; and
forming the word line isolation structure in the fourth trench.

12. A semiconductor structure, comprising:
a substrate;
a plurality of active pillars, arranged as an array in the substrate, wherein each of the active pillars comprises, along a first direction, a first segment, a second segment, and a third segment that are sequentially connected;
a first gate oxide layer, wherein the first gate oxide layer covers sidewalls of the second segment and the third segment; and
a second gate oxide layer, disposed on an outer side of the first gate oxide layer, wherein along the first direction, a length of the second gate oxide layer is less than that of the first gate oxide layer, a top surface of the second gate oxide layer is flush with that of the third segment, and a thickness of the second gate oxide layer is greater than that of the first gate oxide layer.

13. The semiconductor structure according to claim 12, wherein the thickness of the second gate oxide layer is 1 to 2 times that of the first gate oxide layer.

14. The semiconductor structure according to claim 12, wherein the semiconductor structure further comprises a plurality of bit lines, the bit lines are disposed at intervals along a second direction, and each of the bit lines is located at a bottom of the active pillar; wherein
   a top surface of the bit line is provided with a second dielectric layer.

15. The semiconductor structure according to claim 14, wherein the semiconductor structure further comprises a bit line isolation structure; and
   the bit line isolation structure comprises a first dielectric layer and a first isolation layer, the first dielectric layer is located between the substrate and a bottom surface of the bit line, and the first isolation layer is located between adjacent ones of the bit lines.

16. The semiconductor structure according to claim 12, wherein the semiconductor structure further comprises word lines, the word lines are disposed around the second segment of the active pillar, each of the word lines comprises a first word line and a second word line, a bottom surface of the first word line is close to the first segment, a top surface of the second word line is close to the third segment, a plane perpendicular to a second direction is taken as a longitudinal section, and area of a longitudinal section of the first word line is greater than that of a longitudinal section of the second word line.

17. The semiconductor structure according to claim 16, wherein the semiconductor structure further comprises a plurality of word line isolation structures, wherein each of the word line isolation structures is located between adjacent ones of the word lines, a top surface of the word line is provided with a third dielectric layer, and a top surface of the third dielectric layer is flush with that of the active pillar.

\* \* \* \* \*